United States Patent
Irumata et al.

(10) Patent No.: US 8,318,314 B2
(45) Date of Patent: Nov. 27, 2012

(54) BARRIER FILM FOR FLEXIBLE COPPER SUBSTRATE AND SPUTTERING TARGET FOR FORMING BARRIER FILM

(75) Inventors: Shuichi Irumata, Ibaraki (JP); Yasuhiro Yamakoshi, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 585 days.

(21) Appl. No.: 12/640,075

(22) Filed: Dec. 17, 2009

(65) Prior Publication Data
US 2010/0089622 A1    Apr. 15, 2010

Related U.S. Application Data

(62) Division of application No. 11/573,167, filed as application No. PCT/JP2005/013548 on Jul. 25, 2005.

(30) Foreign Application Priority Data

Aug. 10, 2004   (JP) ................. 2004-232872

(51) Int. Cl.
*B32B 15/08* (2006.01)
*B32B 27/00* (2006.01)
*B32B 27/06* (2006.01)
*B32B 15/01* (2006.01)
*B32B 15/00* (2006.01)
*B32B 5/10* (2006.01)
*B32B 15/20* (2006.01)

(52) U.S. Cl. .............. 428/458; 428/473.5; 428/666; 428/647; 428/675

(58) Field of Classification Search .......... 428/458, 428/473.5, 666, 674, 675
See application file for complete search history.

(56) References Cited

U.S. PATENT DOCUMENTS
4,518,627 A * 5/1985 Foley et al. .............. 427/549
(Continued)

FOREIGN PATENT DOCUMENTS
JP          62-263803 A       11/1987
(Continued)

OTHER PUBLICATIONS

Iwasaki et al., "Co—Cr Recording Films with Perpendicular Manetic Anistropy", IEEE Transactions on Magnetics, vol. Mag-14, No. 5, pp. 849-851, Sep. 1978.
(Continued)

*Primary Examiner* — Carol M Koslow
*Assistant Examiner* — Matthew E Hoban
(74) *Attorney, Agent, or Firm* — Howson & Howson LLP

(57) ABSTRACT

A barrier film for a flexible copper substrate comprising a Co—Cr alloy film containing 5 to 30 wt % of Cr and a balance of unavoidable impurities and Co is provided. The barrier film has a thickness of 3 to 150 nm and a film thickness uniformity of 10% or less at 1σ. A sputtering target for forming a barrier film comprising a Co—Cr alloy containing 5 to 30 wt % of Cr and a balance of unavoidable impurities and Co is also provided. The relative magnetic permeability in the in-plane direction of the sputtered face of the target is 100 or less. The barrier film for a flexible copper substrate and the sputtering target for forming such barrier film have a film thickness that is thin enough to prevent film peeling and inhibiting the diffusion of copper to a resin film such as polyimide, is capable of obtaining a sufficient barrier effect even in a minute wiring pitch and has barrier characteristics that will not change even when the temperature rises due to heat treatment or the like.

9 Claims, 1 Drawing Sheet

AES Depth Analysis (Co-20%Cr)

U.S. PATENT DOCUMENTS

| | | | |
|---|---|---|---|
| 4,832,810 A | | 5/1989 | Nakamura et al. |
| 4,847,139 A | * | 7/1989 | Wolf et al. ............... 428/209 |
| 4,908,727 A | | 3/1990 | Ezaki et al. |
| 5,352,501 A | | 10/1994 | Miyamoto et al. |
| 5,456,817 A | * | 10/1995 | Hino et al. ............... 205/125 |
| 5,552,234 A | * | 9/1996 | Kawasumi ............... 428/633 |
| 5,723,198 A | * | 3/1998 | Hosoe et al. ............... 428/141 |
| 6,073,830 A | | 6/2000 | Hunt et al. |
| 6,521,062 B1 | | 2/2003 | Bartholomeusz et al. |
| 6,599,377 B2 | | 7/2003 | Bartholomeusz et al. |
| 6,638,642 B2 | | 10/2003 | Kitano et al. |
| 6,833,198 B2 | | 12/2004 | Sakamoto et al. |
| 6,835,241 B2 | | 12/2004 | Tsuchida et al. |
| 6,960,391 B2 | | 11/2005 | Natsume et al. |
| 7,341,796 B2 | | 3/2008 | Hanafusa |
| 7,364,666 B2 | * | 4/2008 | Dasaratha et al. ............... 216/83 |
| 2002/0182432 A1 | | 12/2002 | Sakamoto et al. |
| 2004/0209109 A1 | | 10/2004 | Tsuchida et al. |
| 2007/0187236 A1 | | 8/2007 | Nakamura et al. |
| 2009/0208762 A1 | | 8/2009 | Akase |

FOREIGN PATENT DOCUMENTS

| | | |
|---|---|---|
| JP | 05-283848 A | 10/1993 |
| JP | 10-008243 A | 1/1998 |
| JP | 2000-096220 A | 4/2000 |
| JP | 2002-208125 A | 7/2002 |
| JP | 2002-252257 A | 9/2002 |
| JP | 2002-280684 A | 9/2002 |
| JP | 2004-006584 A | 1/2004 |

OTHER PUBLICATIONS

Rogers et al., "The Dependence of Compositional Separation on Film Thickness for Co—Cr and Co—Cr—Ta Magnetic Recording Media", IEEE Transactions on Magnetics, vol. 30, No. 6, pp. 3972-3974, Nov. 1994.

Isurugi et al., "Influence of Surface Roughness on Durability of Co—Cr Perpendicular Magnetic Recording Medium", IEEE Transactions on Magnetics in Japan, vol. 4, No. 1, pp. 3-9, Jan. 1989.

* cited by examiner

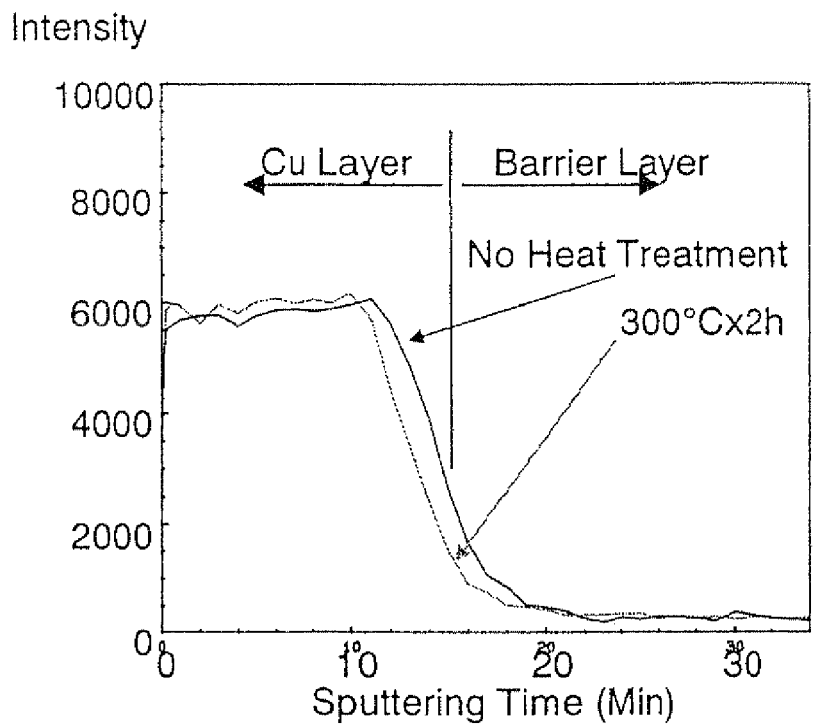
Fig. 1 AES Depth Analysis (Co-20%Cr)
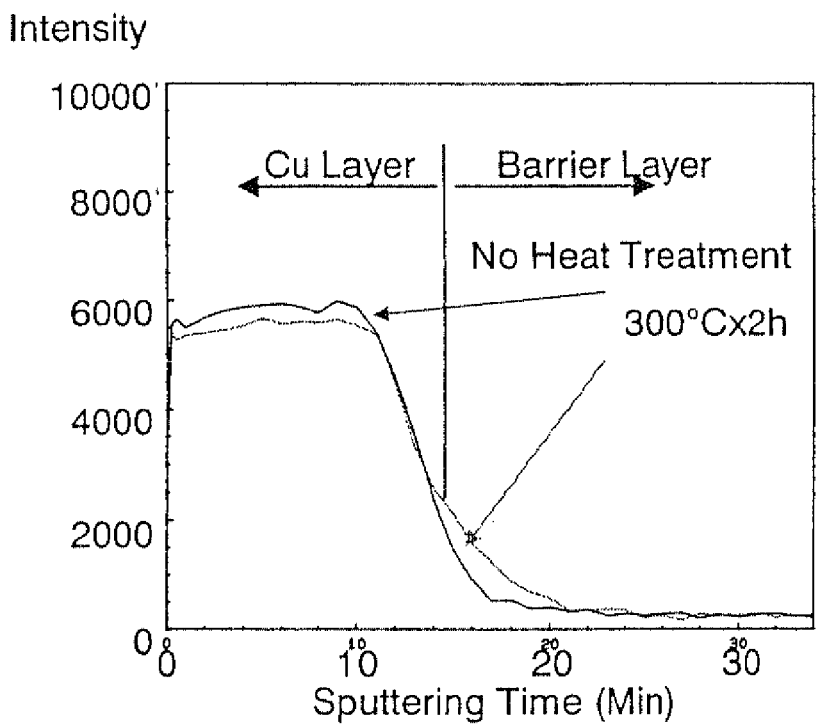
Fig. 2 AES Depth Analysis (Ni-20%Cr)

BARRIER FILM FOR FLEXIBLE COPPER SUBSTRATE AND SPUTTERING TARGET FOR FORMING BARRIER FILM

CROSS REFERENCE TO RELATED APPLICATIONS

This application is a divisional of co-pending U.S. application Ser. No. 11/573,167, which is the National Stage of International Application No. PCT/JP2005/013548, filed Jul. 25, 2005, which claims the benefit under 35 USC §119 of Japanese Application No. 2004-232872, filed Aug. 10, 2004.

BACKGROUND OF THE INVENTION

The present invention relates to a barrier film for a flexible copper substrate and a sputtering target for forming such barrier film capable of effectively inhibiting the diffusion of copper to a resin film such as polyimide.

Conventionally, a copper layer is formed on a resin film such as polyimide, which is to become the base film, upon manufacturing a flexible copper substrate. Specifically, a copper seed layer is formed on the polyimide film by sputtering or electroless deposition, and a thick copper plated layer is formed thereon. Thereafter, the copper is subject to etching so as to form a copper circuit pattern.

The problem here is that the copper formed on the polyimide film easily diffuses (migrates) in the polyimide film, and causes a short circuit in the wiring on the circuit board.

In order to inhibit this kind of diffusion of Cu to the polyimide film, proposed is a method of forming in advance a barrier layer for preventing the diffusion of Cu on the polyimide film, and forming a Cu seed layer and a thick Cu plated layer thereon.

As a representative example, there is technology which forms a Ni—Cr alloy barrier layer. See Japanese Patent Laid-Open Publication No. 2002-252257.

Nevertheless, when the temperature rises to about 200 to 300° C., diffusion of Cu to the polyimide film can still be acknowledged. In addition, when the wiring pitch becomes narrower than 30 µm, it is not possible to prevent diffusion to the polyimide layer with a conventional barrier layer, and it has become known that this is not necessarily effective.

As a means for preventing the foregoing problem, it is conceivable that the barrier characteristics can be improved by thickening the conventional barrier layer. Nevertheless, when the thickness exceeds a certain value, another problem occurs in that the barrier film would peel from the polyimide film. Therefore, this method was insufficient to become a fundamental solution.

As another proposal, suggested is a method of forming a thermoplastic polyimide layer on a thermosetting polyimide base film, covering this with a barrier metal formed from at least one type of metal selected from Ni, Cr, Co and Mo, heating and fluidizing the thermoplastic resin, and increasing the bonding strength between the thermoplastic polyimide and the barrier metal. See Japanese Patent Laid-Open Publication No. 2002-280684.

Nevertheless, in this case, since the foregoing method does not fundamentally solve the diffusion of the barrier metal, this problem still needs to be solved.

SUMMARY OF THE INVENTION

In light of the foregoing problems of conventional technology, an object of the present invention is to obtain a barrier film for a flexible copper substrate and a sputtering target for forming such barrier film. The barrier film for a flexible copper substrate can inhibit the diffusion of copper to a resin film such as polyimide. Further, the film thickness is thin enough to prevent film peeling, and is capable of obtaining a sufficient barrier effect even in a minute wiring pitch. Moreover, the barrier characteristics will not change even when the temperature rises due to heat treatment or the like.

As a result of intense study, the present inventors discovered that the foregoing problems can be overcome by using an alloy having effective barrier characteristics, forming the barrier film as thin as possible in order to prevent peeling, and improving the uniformity of the deposited film.

Based on the foregoing discovery, the present invention provides a barrier film for a flexible copper substrate comprising a Co—Cr alloy film containing 5 to 30 wt % of Cr and a balance of unavoidable impurities and Co, having a film thickness of 3 to 150 nm, and film thickness uniformity of 10% or less at 1σ. In addition, the present invention provides a sputtering target for forming a barrier film comprising a Co—Cr alloy containing 5 to 30 wt % of Cr and a balance of unavoidable impurities and Co, wherein the relative magnetic permeability in the in-plane direction of the sputtered face is 100 or less.

The barrier film for a flexible copper substrate of the present invention yields superior effects in that it has a film thickness that is thin enough to prevent film peeling, is capable of obtaining a sufficient barrier effect even in a minute wiring pitch, and has barrier characteristics that will not change even when the temperature rises due to heat treatment or the like. The present invention yields significant characteristics in that it is capable of effectively inhibiting the diffusion of copper to a resin film such as polyimide.

BRIEF DESCRIPTION OF THE DRAWINGS

FIG. 1 is a diagram showing the analysis (AES) of Cu diffusion in the case of using the Co—Cr alloy barrier film of Example 1; and FIG. 2 is a diagram showing the analysis (AES) of Cu diffusion in the case of using the Ni—Cr alloy barrier film of Comparative Example 1.

DETAILED DESCRIPTION OF THE INVENTION

The barrier film for a flexible copper substrate according to the present invention is a Co—Cr alloy film containing 5 to 30 wt % of Cr and a balance of unavoidable impurities and Co.

In the film composition, if the Cr content is less than 5 wt %, the barrier properties will be insufficient, and there will be no advantage over conventional barrier films. Further, if the Cr content exceeds 30 wt %, it would be impractical since the barrier film will interfere with the etching of the Cu layer to form a circuit, and much time will be required in eliminating such barrier film. Accordingly, the Cr content shall be within the foregoing range.

The film thickness of the barrier film for a flexible copper substrate of the present invention shall be 3 to 150 nm. If the film thickness is less than 3 nm, sufficient barrier properties cannot be obtained. Further, if the film thickness exceeds 150 nm, the film will easily peel. Thus, the film thickness shall be within the foregoing range.

The film thickness of the barrier film for a flexible copper substrate of the present invention shall have a film thickness uniformity of 10% or less at 1σ. When the film thickness uniformity (1σ) exceeds 10%, there is a problem in that, during etching process, the portion where the barrier film is thin will be etched broader than the portion to be removed when etching is performed until the thick portion of the barrier film is to be removed, and the linewidth of such portion will become narrow. As a result, the durability of the actual device will deteriorate. Accordingly, the film thickness uniformity ($1\sigma$) shall be 10% or less.

The sputtering target for forming a barrier film according to the present invention employs a Co—Cr alloy target containing 5 to 30 wt % of Cr and a balance of unavoidable impurities and Co. The composition of the Co—Cr alloy target of the present invention is directly reflected to the composition of the barrier film. In other words, when the Cr content in the target composition is less than 5 wt %, it is not possible to deposit a Co alloy film having 5 wt % or more of Cr.

Meanwhile, when the Cr content exceeds 30 wt %, it is not possible to deposit a Co alloy film having 30% or less of Cr. Therefore, the composition of the Co—Cr alloy target shall be within the foregoing range.

Moreover, with the sputtering target for forming a barrier film according to the present invention, the relative magnetic permeability in the in-plane direction of the sputtered face shall be 100 or less. If the relative magnetic permeability exceeds 100, the film thickness uniformity of the sputtered film will exceed 10% at $1\sigma$.

It is desirable that the Co—Cr alloy target of the present invention has an average grain size of 500 µm or less, preferably 100 µm or less. This is because if the average grain size exceeds 500 µm, the generation of particles will increase, a film defect known as pinholes will increase, and the production yield will deteriorate.

Further, with the Co—Cr alloy target of the present invention, it is desirable that the variation of the average grain size in the target is 30% or less. This is because if the variation of the average grain size exceeds 30%, the film thickness uniformity of the film subject to sputtering deposition could exceed 10% at $1\sigma$.

Upon manufacturing the target of the present invention, it is desirable to process the target board with a combination of hot forging and rolling at 800 to 1370° C.

Further, after performing the foregoing hot forging and rolling, it is desirable to perform heat treatment in the atmosphere, in a vacuum, or under an inert gas atmosphere at a holding temperature of 300 to 960° C.

The heat treated plate obtained as described above is machined into a target shape, and the average roughness (Ra) of the sputtering surface is made to be 0.01 to 5 µm.

Further, it is desirable that the non-sputtering surface such as the target side or backing plate; that is, the portions to which the sputtered substances adhere, should be roughened such that the average roughness (Ra) of the surface becomes 1 to 50 µm by bead blasting, etching or spraying so as to prevent the peeling of the deposited film. This is because substances that peel and float in the sputtering atmosphere cause the generation of particles on the substrate.

It is desirable that the target of the present invention is bonded to a backing plate formed from an Al alloy, Cu, Cu alloy, Ti, or Ti alloy by way of metallic bonding such as brazing, diffusion bonding or friction pressure welding so that it can endure high power sputtering.

Further, as impurities contained in the target, it is desirable that the concentrations of Na and K are respectively 5 ppm or less (hereinafter, ppm represents wtppm), the concentrations of U and Th are respectively 0.05 ppm or less, the total amount of metallic elements except principal elements and added elements is 0.5 wt % or less, and the oxygen concentration is 0.5 wt % or less.

EXAMPLES

The present invention is now explained in further detail with reference to the Examples. These Examples are merely illustrative, and the present invention shall never be limited thereby. In other words, the present invention shall only be limited by the scope of the present invention, and shall include the various modifications other than the Examples of this invention.

Example 1

The composition of Co-20 wt % Cr was subject to melting and casting to prepare a Co—Cr ingot. This ingot was subject to hot forging and hot rolling at 1100° C., cooled, and thereafter subject to heat treatment at 500° C. for 2 hours and machined into a target. The grain size of this target was 280 µm. This target was further subject to finishing so that the average surface roughness Ra became 0.14 µm.

The Cr concentration of the target was 19.1 wt %, impurity components were 0.2 ppm of Na, 0.1 ppm of K, 0.02 ppm of U, 0.03 ppm of Th, the total content of metal components was 470 ppm, and the oxygen content was 10 ppm.

This target was bonded to the backing plate with indium, and the target side and the backing plate near the target were subject to bead blasting and coarsened until the Ra became 7.5 µm.

This target was used to prepare a barrier layer having a film thickness of 140 nm. As a result of analyzing the composition of the respective added components of this barrier layer, there was 18.3 wt % of Cr, and coincided with the composition with a slightly low content of Cr. The film thickness of this barrier layer was measured with a 49-point measurement, and the film thickness uniformity was 7.2% at $1\sigma$.

Cu layer of 200 nm thickness was deposited on this barrier layer with sputtering.

With respect to this Cu/Co—Cr laminated film, a depth profile of a sample only subject to the foregoing deposition and a sample that was further subject to heat treatment in a vacuum at 300° C.×2 hours was taken with AES (Auger electron spectroscopy), and the diffusion of Cu to the barrier layer was, evaluated.

FIG. 1 shows the results of depth profile with AES. With the barrier film formed from Co—Cr that were subject to heat treatment at 300° C., the Cu profile was the same profile as the sample that was not subject to heat treatment, and diffusion to the barrier layer could not be acknowledged.

Comparative Example 1

A material having a composition of Ni-20 wt % Cr, which is a conventional barrier material, was subject to melting and casting to prepare a Ni—Cr ingot. This ingot was subject to hot forging and hot rolling at 1100° C., cooled, and thereafter subject to heat treatment at 500° C. for 2 hours and processed into a target.

The grain size of the target was 300 µm, and the surface roughness was subject to finishing so that the Ra became 0.15 µm. The Cr concentration in the target was 19.7 wt %, impurity components were 0.1 ppm of Na, 0.3 ppm of K, 0.02 ppm of U, 0.04 ppm of Th, the total content of metal components was 510 ppm, and the oxygen content was 10 ppm.

This target was bonded to the backing plate with indium, and the target side and the backing plate near the target were subject to bead blasting and roughened until the Ra became 7.0 µm. The relative magnetic permeability in the in-plane direction of the target was 130.

Using this target, a barrier film having a film thickness of 140 nm was formed on a $SiO_2$ substrate so that the barrier film would not peel.

As a result of the composition analysis of the respective added components of this barrier layer, there was 18.5 wt % of Cr and the composition of the layer is slightly lower than that of the target. The film thickness of this barrier layer was measured at 49-point, and the film thickness uniformity was 7.4% at 1σ.

A 200 nm Cu film was deposited on this barrier layer with sputtering. For this Cu/Ni—Cr film, a profile in the depth direction of a sample only subject to the foregoing deposition and a sample that was further subject to heat treatment in a vacuum at 300° C.×2 hours were analyzed by AES (Auger electron spectroscopy), and the diffusion of Cu to the barrier layer was evaluated. FIG. 2 shows the results of AES.

The Cu of the sample that was subject to heat treatment at 300° C. was diffused deeper into the barrier layer in comparison to the sample that was not subject to heat treatment. In other words, it has been discovered that the function as a barrier layer is inferior.

Example 2 to 8

A target was prepared with the same manufacturing method as Example 1, and such target having an alloy composition and relative magnetic permeability within the range of the present invention shown in Table 1 was used to form a barrier layer having a film thickness of 10 nm on a polyimide sheet having a thickness of 38 μm.

Further, the composition (wt %) of the respective added components of the barrier layer, the film thickness (nm) of the barrier layer, the film thickness uniformity (%) that measured the film thickness of the barrier layer at a 49-point, and the endurance test (hours) are similarly shown in Table 1. The film composition (wt %), film thickness (nm), and film thickness uniformity (%) of the barrier film of Examples 2 to 8 were all within the range of the present invention.

Further, a 20 nm Cu seed layer was deposited on this barrier layer with sputtering, and this was further subject to electroplating so as to form a Cu layer of 8 μm. An endurance test was performed to a wiring pattern prepared with a 30 μm pitch (linewidth 15 μm, distance between wires 15 μm) by applying a +60V voltage, and retaining the wiring pattern in an atmosphere having a temperature of 85° C. and humidity of 85%. The results are similarly shown in Table 1.

As a result of the above, Examples 2 to 8 did not cause a short circuit in its wires.

Comparative Example 2

The same target as Comparative Example 1 shown in Table 1 was used, and a Ni—Cr barrier layer having a film thickness of 10 nm was formed on a polyimide sheet having a thickness of 38 μm.

Further, the composition (wt %) of the respective added components of the barrier layer, the film thickness (nm) of the barrier layer, the film thickness uniformity (%) that measured the film thickness of the barrier layer at a 49-point, and the endurance test (hours) are similarly shown in Table 1.

The alloy component (Ni—Cr) of the barrier film of Comparative Example 2 is out of the range of the present invention.

Moreover, a 20 nm Cu seed layer was deposited on this barrier layer by sputtering, and this was further subject to electroplating so as to form a Cu layer of 8 μm. An endurance test was performed to a wiring pattern prepared with a 30 μm pitch (linewidth 15 μm, distance between wires 15 μm) by applying a +60V voltage, and retaining the wiring pattern in an atmosphere having a temperature of 85° C. and humidity of 85%. The results are similarly shown in Table 1.

As a result of performing the foregoing endurance test, although Comparative Example 2 lasted for 350 hours, it caused a short circuit in the wires thereafter.

Comparative Example 3

A target was prepared with the same manufacturing method as Example 1, and a target having an alloy composition outside the range of the present invention (Cr content is less than the present invention) as shown in Table 1 was used to form a Co—Cr barrier layer having a film thickness of 10 nm on a polyimide sheet having a thickness of 38 μm.

Further, the composition (wt %) of the respective added components of the barrier layer, the film thickness (nm) of the barrier layer, the film thickness uniformity (%) that measured the film thickness of the barrier layer at a 49-point, and the endurance test (hours) are similarly shown in Table 1.

The film composition (3.5 wt % of Cr) of the barrier film of Comparative Example 3 was less than the Cr content (5 to 30 wt %) of the film according to the present invention.

Moreover, a 20 nm Cu seed layer was deposited on this barrier layer, and this was further subject to electrodeposition so as to form a Cu layer of 8 μm. An endurance test was performed to a wiring pattern prepared with a 30 μm pitch (linewidth 15 μm, distance between wires 15 μm) by applying a +60V voltage, and retaining the wiring pattern in an atmosphere having a temperature of 85° C. and humidity of 85%. The results are similarly shown in Table 1.

As a result of performing the foregoing endurance test, although Comparative Example 3 lasted for 210 hours, it caused a short circuit in the wires thereafter.

Comparative Example 4

A target was prepared with the same manufacturing method as Example 1, and a target having an alloy composition outside the range of the present invention (Cr content is more than the present invention) as shown in Table 1 was used to form a Co—Cr barrier layer having a film thickness of 10 nm on a polyimide sheet having a thickness of 38 μm.

Further, the composition (wt %) of the respective added components of the barrier layer, the film thickness (nm) of the barrier layer, the film thickness uniformity (%) that measured the film thickness of the barrier layer at a 49-point, and the endurance test (hours) are similarly shown in Table 1.

The film composition (33.1 wt % of Cr) of the barrier film of Comparative Example 4 was less than the Cr content (5 to 30 wt %) of the film according to the present invention.

Moreover, a 20 nm Cu seed layer was deposited on this barrier layer, and this was further subject to electroplating so as to form a Cu layer of 8 μm. Although an attempt was made to prepare a wiring pattern prepared with a 30 μm pitch (linewidth 15 μm, distance between wires 15 μm), the Co—Cr layer remained since it could not be etched, and a pattern could not be formed.

Comparative Example 5

A target was prepared with the same manufacturing method as Example 1, and a target having a relative magnetic permeability outside the range of the present invention as shown in Table 1 was used to form a Co—Cr barrier layer having a film thickness of 10 nm on a polyimide sheet having a thickness of 38 μm.

Further, the composition (wt %) of the respective added components of the barrier layer, the film thickness (nm) of the barrier layer, the film thickness uniformity (%) that measured the film thickness of the barrier layer at a 49-point, and the endurance test (hours) are similarly shown in Table 1.

Moreover, a 20 nm Cu seed layer was deposited on this barrier layer, and this was further subject to electroplating so as to form a Cu layer of 8 μm. An endurance test was performed to a wiring pattern prepared with a 30 μm pitch (linewidth 15 μm, distance between wires 15 μm) by applying a +60V voltage, and retaining the wiring pattern in an atmosphere having a temperature of 85° C. and humidity of 85%. The results are similarly shown in Table 1.

As a result of performing the foregoing endurance test, although Comparative Example 5 lasted for 470 hours, it caused a short circuit in the wires thereafter. In addition, the film thickness uniformity was also considerably inferior.

Comparative Example 6

A target was prepared with the same manufacturing method as Example 1, and a target shown in Table 1 was used to perform sputtering, and a Co—Cr barrier layer having a film thickness of 2.5 nm which is out of the range of the present invention (thinner than the present invention) was formed on a polyimide sheet having a thickness of 38 μm.

Further, the composition (wt %) of the respective added components of the barrier layer, the film thickness (nm) of the barrier layer, the film thickness uniformity (%) that measured the film thickness of the barrier layer at a 49-point, and the endurance test (hours) are similarly shown in Table 1.

Moreover, an endurance test was performed to a wiring pattern prepared with a 30 μm pitch (linewidth 15 μm, distance between wires 15 μm) by applying a +60V voltage, and retaining the wiring pattern in an atmosphere having a temperature of 85° C. and humidity of 85%. The results are similarly shown in Table 1.

As a result of performing the foregoing endurance test, although Comparative Example 6 lasted for 390 hours, it caused a short circuit in the wires thereafter. It has become clear that when the film thickness of the barrier layer is insufficient, diffusion of Cu to the polyimide sheet will occur, resulting in no durability.

Comparative Example 7

A target was prepared with the same manufacturing method as Example 1, and, under the condition that the film thickness of the barrier layer is outside the range of the present invention as shown in Table 1, a Co—Cr barrier layer having a film thickness of 180 nm which is out of the range of the present invention (thicker than the present invention) was formed on a polyimide sheet having a thickness of 38 μm.

The composition of the respective added components of the barrier layer and the film thickness (nm) of the barrier layer are similarly shown in Table 1. Nevertheless, since the barrier layer peeled, it was impossible to perform subsequent measurements. Accordingly, it has become clear that excess film thickness of the barrier layer is inappropriate.

TABLE 1

|  | Target Composition | Relative Magnetic Permeability of Target | Film Composition (wt %) | Film Thickness of Barrier Layer (nm) | Uniformity of Film Thickness (%) | Endurance Test (hours) |
|---|---|---|---|---|---|---|
| Example 2 | Co—19.1 wt % Cr | 30 | 18.3 | 10 | 6.5 | >1000 |
| Example 3 | Co—19.1 wt % Cr | 30 | 18.1 | 3 | 7 | >1000 |
| Example 4 | Co—19.1 wt % Cr | 30 | 18.1 | 30 | 6.1 | >1000 |
| Example 5 | Co—19.1 wt % Cr | 30 | 18.5 | 140 | 6.8 | >1000 |
| Example 6 | Co—4.5 wt % Cr | 25 | 5.2 | 10 | 8.9 | >1000 |
| Example 7 | Co—30.0 wt % Cr | 32 | 29.8 | 10 | 7.2 | >1000 |
| Example 8 | Co—22.3 wt % Cr | 70 | 21.3 | 10 | 8.2 | >1000 |
| Comparative Example 2 | Ni—18.5 wt % Cr | — | 18.1 | 10 | 7.6 | 350 |
| Comparative Example 3 | Co—3.5 wt % Cr | — | 4.2 | 10 | 8.9 | 210 |
| Comparative Example 4 | Co—37.5 wt % Cr | — | 33.1 | 10 | 10.2 | Defective Patterning |
| Comparative Example 5 | Co—22.1 wt % Cr | 120 | 21.9 | 10 | 15.3 | 470 |
| Comparative Example 6 | Co—19.1 wt % Cr | 30 | 18.2 | 2.5 | 6.3 | 390 |
| Comparative Example 7 | Co—19.1 wt % Cr | 30 | 18.3 | 180 | Film Peeling | N/A |

The present invention yields superior effects in that it is capable of obtaining sufficient barrier effects even in a fine wiring pitch, and has barrier characteristics that will not change even when the temperature increases due to heat treatment or the like. Accordingly, the present invention is effective as a barrier film for a flexible copper substrate since it possesses superior barrier characteristics against the diffusion of copper to a resin film such as polyimide.

We claim:

1. A flexible copper substrate, comprising:
   a resin film, a layer of copper, and a barrier layer located between said resin film and said layer of copper;
   said barrier layer separating said layer of copper from said resin film, inhibiting diffusion of copper from said layer of copper to said resin film, and resisting peeling from said resin layer;
   said barrier layer consisting of a Co—Cr alloy film containing 5 to 30 wt % of Cr and a balance of Co and having a film thickness of 3 to 150 nm and a film thickness uniformity of 10% or less at 1σ.

2. A flexible copper substrate according to claim 1, wherein said Co—Cr alloy film is of uniform composition and non-segregated entirely throughout said Co—Cr alloy film to inhibit diffusion of copper therethrough at any location thereof.

3. A flexible copper substrate according to claim 1, wherein said copper layer is in the form of a copper circuit pattern.

4. A flexible copper substrate according to claim 3, wherein said copper circuit pattern has a minute wiring pitch of 30 μm or less and said barrier layer prevents short circuiting of said circuit pattern by inhibiting the diffusion of copper therethrough.

5. A flexible copper substrate according to claim 4, wherein said minute wiring pitch includes wiring linewidth of 15 μm and a distance between wiring of 15 μm.

6. A flexible copper substrate according to claim 1, wherein said barrier layer is a sputtered film produced by a thin film sputtering operation and is sputtered directly onto said resin film.

7. A flexible copper substrate according to claim 6, wherein said layer of copper includes a copper seed layer produced by a thin film sputtering operation and is sputtered directly onto said barrier layer.

8. A flexible copper substrate according to claim 7, wherein said layer of copper includes a copper plated layer electroplated directly on said copper seed layer.

9. A flexible copper substrate according to claim 8, wherein said resin layer is a polyimide film.

* * * * *